United States Patent [19]

Uchino

[11] Patent Number: 5,067,983

[45] Date of Patent: Nov. 26, 1991

[54] METHOD AND APPARATUS FOR CLEANING OBJECT

[75] Inventor: Masahide Uchino, Tokyo, Japan

[73] Assignee: Japan Field Company Ltd., Tokyo, Japan

[21] Appl. No.: 529,416

[22] Filed: May 29, 1990

[30] Foreign Application Priority Data

May 29, 1989 [JP] Japan .................................. 1-135461

[51] Int. Cl.$^5$ ........................... B08B 3/04; B08B 3/10; B08B 3/12; B08B 7/02

[52] U.S. Cl. ......................................... 134/1; 134/42; 134/135; 134/184

[58] Field of Search .................... 134/184, 135, 1, 42

[56] References Cited

U.S. PATENT DOCUMENTS

| | | | |
|---|---|---|---|
| 2,828,231 | 3/1958 | Henry | 134/1 |
| 4,763,677 | 8/1988 | Miller | 134/1 |
| 4,865,060 | 9/1989 | Shibano | 134/184 |
| 4,886,082 | 12/1989 | Kato et al. | 134/184 |
| 4,909,266 | 3/1990 | Massa | 134/184 |
| 4,940,494 | 7/1990 | Petit et al. | 134/184 |

Primary Examiner—Theodore Morris
Assistant Examiner—Zeinab El-Arini
Attorney, Agent, or Firm—Schwartz & Weinrieb

[57] ABSTRACT

To clean electronic parts, machine parts, medical equipment and the like, even if a solvent is detrimental to the human body, environment, and the like such as, for example isopropyl alcohol, another alcohol, a terpene oil, a hydrocarbon solvent, or other combustible solvent is used as a cleaning liquid, safe cleaning that prevents the cleaning liquid from igniting can be carried out since the cleaning process is carried out in such a manner that a cleaning means holding a cleaning liquid is positioned within a holding tank containing an incombustible liquid with the cleaning means submerged within the tank, or with the gateway of the cleaning means nonsubmerged, or with the cleaning means the surface of the incombustible liquid.

24 Claims, 7 Drawing Sheets

METHOD AND APPARATUS FOR CLEANING OBJECT

BACKGROUND OF THE INVENTION

1. Field of the Invention

The present invention relates to a method and an apparatus for cleaning objects such as, for example, electronic parts, machine parts, and medical instruments, and is particularly useful in the case of using as, for example, as a cleaning fluid a solvent harmful to the human body, environment, or the like or a solvent that is highly combustible and is therefore accompanied by means of grave risk during use.

2. Description of the Prior Art

Conventionally, in order to clean electronic parts, machine parts, medical instruments, or the like, solvents such as, for example, Freon and trichloroethylene that are detrimental to the human body, environment, or the like are used in many cases as a cleaning fluid for cleaning the objects. However, these solvents are not completely free from the problem that the solvents leak outside of the cleaning apparatus. Therefore, solvents that less detrimental to the human body, environment, or the like, such as, alcohols such as, for example, isopropyl alcohol, terpenes, hydrocarbon solvents, and other combustible solvents are.

However, since these are highly flammable, the use thereof is attended with a higher risk, and they are difficult to use. Particularly, these combustible solvents are high in risk such that when the solvent gas leaks outside the apparatus, it catches fire from sparks or static electricity produced by means of the outer equipment. There are apparatus that have been developed so as to eliminate such a risk, but the apparatus have complicated mechanisms, which make them expensive, and practically the use is difficult.

OBJECT OF THE INVENTION

The present invention intends to solve the above-mentioned problems, and the object of the present invention is to provide a method and apparatus for cleaning objects that insures a high degree of safety while using as, for example a cleaning fluid, alcohols such as isopropyl alcohol, hydrocarbon solvents, terpenes, or other combustible solvents, and to positively prevent the diffusion of the solvent into the atmosphere even when solvents that are harmful to the human body, environment, and the like such as, for example, Freon and trichloroethylene are used.

SUMMARY OF THE INVENTION

Specifically, in order to solve the above-mentioned problems, the present invention provides a method and apparatus for cleaning, objects characterized in that a cleaning means containing a solvent as a cleaning fluid is positioned within a holding tank containing an incombustible liquid, and is operated within the holding tank so as to clean an object.

BRIEF DESCRIPTION OF THE DRAWINGS

The foregoing and other objects, advantages, features, and application of the present invention will become more apparent from the following description when considered in connection with the attached drawings, in which like reference characters designate like or corresponding parts throughout the several views, and wherein.

DESCRIPTION OF THE PREFERRED EMBODIMENTS

Figure 1:
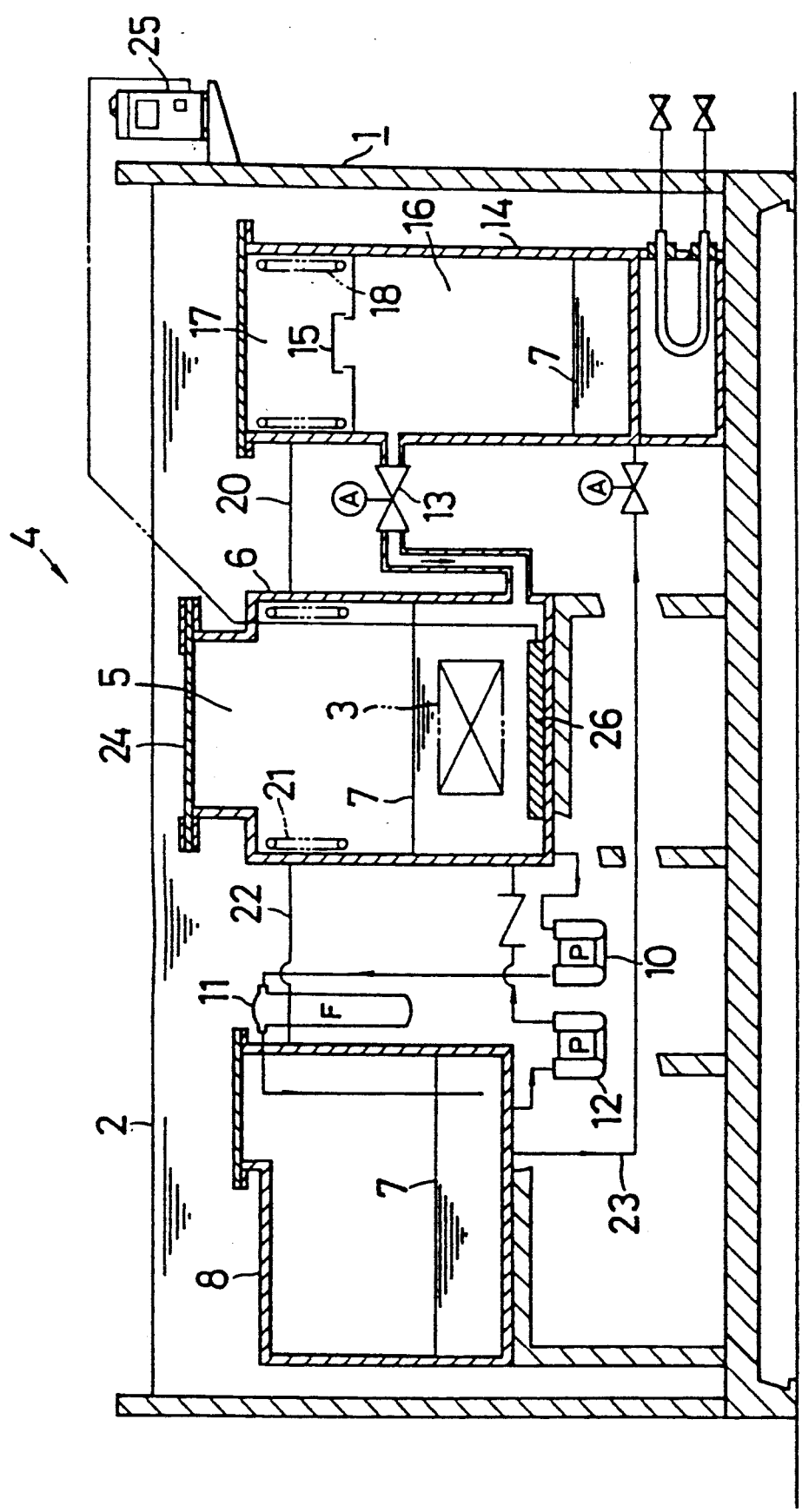
FIG. 1 is a cross-sectional view showing the state of liquid cleaning of an object in accordance with a first embodiment of the present invention.

The present invention will now be described with reference to the drawings. Reference numeral (1) indicates a holding tank containing an incombustible liquid (2) such as, for example, water, an incombustible oil and the like, and a cleaning means (4) for cleaning an object (3) which is submerged within the holding tank (1). If the cleaning means (4) maintains the liquid-tightness state so as not to allow the incombustible liquid (2) to enter the interior of the cleaning tank (6) when the cleaning means (4) is placed within the incombustible liquid (2), the constitution of the cleaning means (4) for the object (3) is not particularly limited, and for the cleaning means (4), any structure meeting the cleaning purposes can be chosen.

As shown in the figure, in accordance with this embodiment, a cleaning tank (6) where the object (3) introduced through means of a gateway (5) will be cleaned is placed in a position so as to be submerged within the incombustible liquid (2) of the holding tank (1), the cleaning tank (6) and a liquid solvent tank (8) filled with a liquid solvent (7) are connected through means of a lead-out pump (10) and a filtering mechanism (11) so that the liquid solvent (7) can be transferred from the cleaning tank (6) to the liquid solvent tank (8), the cleaning tank (6) and the liquid solvent tank (8) filled with the liquid solvent (7) are also connected through means of a lead-in pump (12) so that the liquid solvent (7) can be transferred from the liquid solvent-tank (8) to the cleaning tank (6), and the cleaning tank (6) is also connected to a vapor generating tank (14) through means of an ON/OFF valve (13). The vapor generating tank (14) is provided with an interior lid (15) that can be pushed and open by means of an increase of the vapor pressure and is positioned between a vapor generating section (16) and a condensing chamber (17), and the condensing chamber (17) has a cooling pipe (18) for condensing the vapor. The condensate produced within the condensing chamber (17) is led into the cleaning tank (6) through means of a lead-out pipe (20), and a cooling pipe (21) for condensing vapor within cleaning tank (6) is similarly provided near the gateway (5) within the cleaning tank (6) so that the condensate is led into the liquid solvent tank (8) through means of a lead-out pipe (22). The liquid solvent tank (8) and the vapor generating tank (14) are also connected through means of a supply pipe (23) for the liquid solvent (7).

Figure 3:
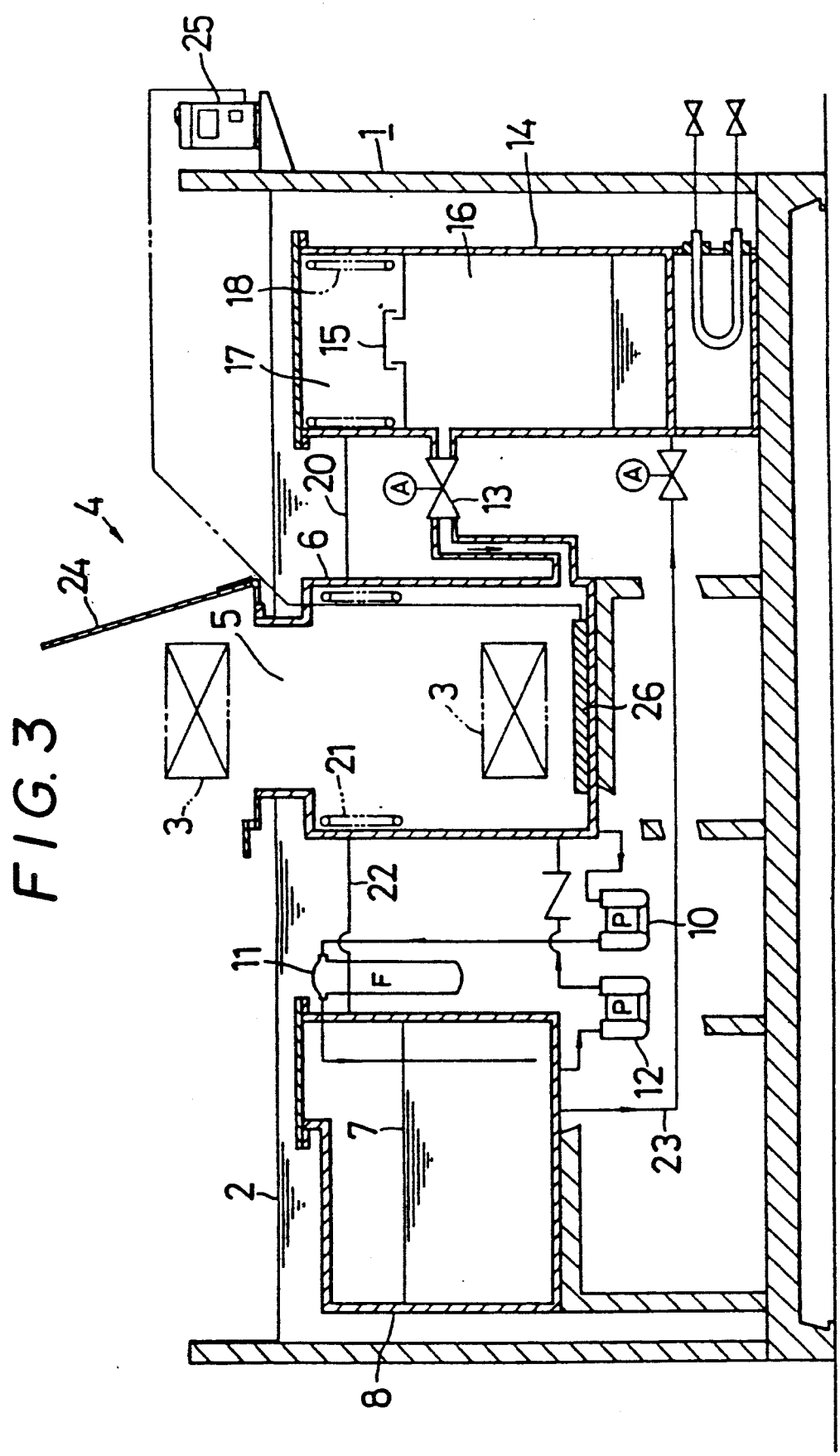
FIG. 3 is a cross-sectional view showing the state where an object is inserted into or removed from the cleaning tank.

In order to carry out the cleaning of the object (3) by means of the above arrangement, as shown in FIG. 3, the incombustible liquid (2) is removed from the holding tank (1) until the gateway (5) of the cleaning tank (6) extends above the surface of the incombustible liquid (2), while the vapor generating tank (14) and the liquid solvent tank (8) are submerged, and then the gateway (5) of the cleaning tank (6) is opened so as to introduce the object (3). "Removal" or "pouring" (described later) of the incombustible liquid (2) with respect to the holding tank (1) is carried out by a known means including a pipe, a valve, a controlling tank, and the like (not shown).

Figure 2:
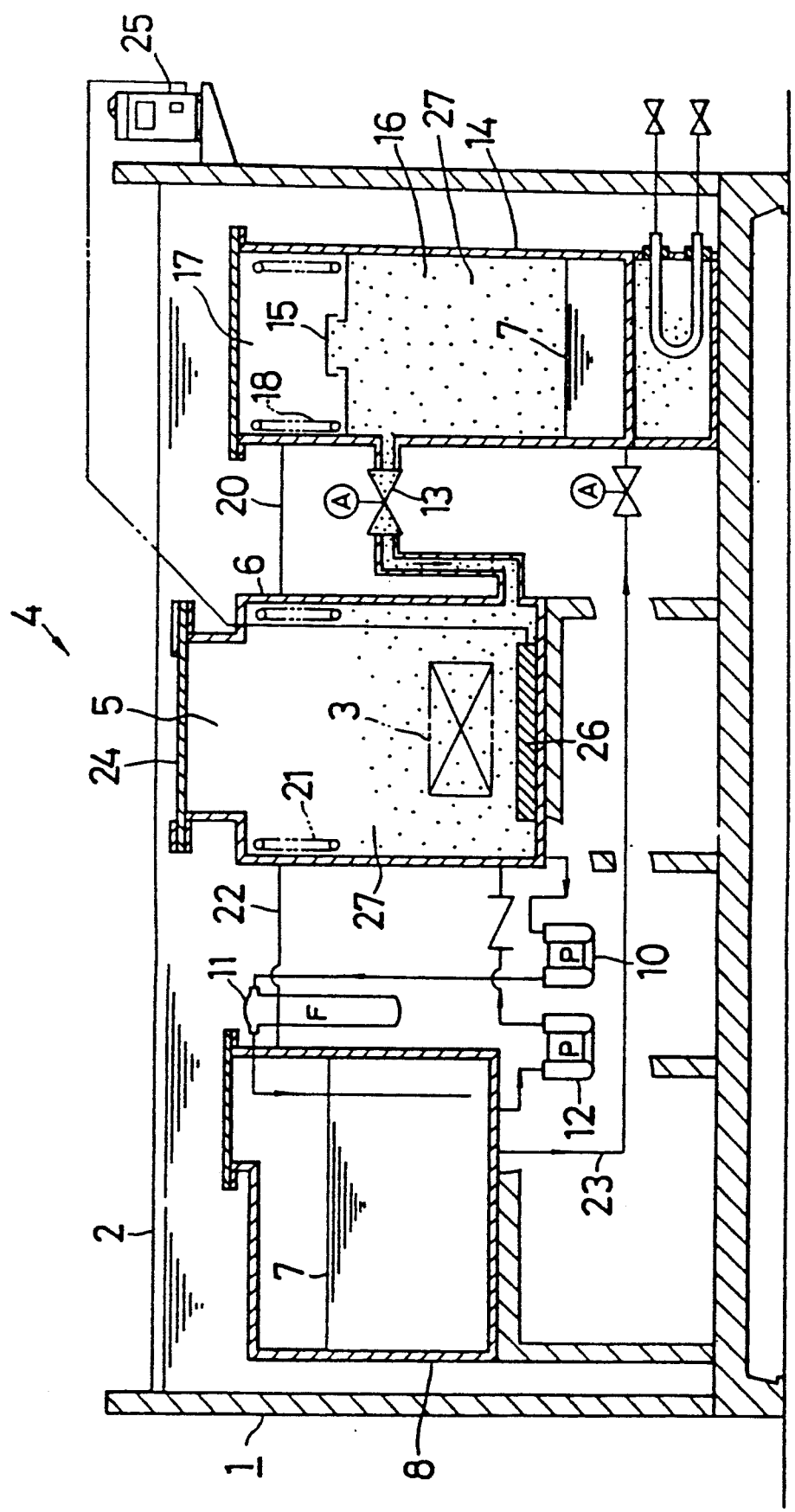
FIG. 2 is a cross-sectional view showing the state of vapor transmission between tank components of the system of FIG. 1.

Subsequently, a lid body (24) for opening or closing the gateway (5) of the cleaning tank (6) is closed, and then as shown in FIG. 1, additional incombustible liquid (2) is poured into the holding tank (1) until the gateway (5) is submerged, the liquid solvent (7) is then transferred from the liquid solvent tank (8) into the cleaning tank (6), and for example ultrasonic cleaning is effected by means of an ultrasonic vibrator (26) connected to an ultrasonic oscilator (25). After the completion of the liquid cleaning, as shown in FIG. 2, the liquid solvent (7) within the cleaning tank (6) is removed and is transferred to the liquid solvent tank (8), the ON/OFF valve (13) is opened, and the cleaning vapor (27) is introduced into the cleaning tank (6) so as to carry out vapor cleaning. Of course, the vapor cleaning may be carried out without the preceding liquid cleaning.

Figure 4:
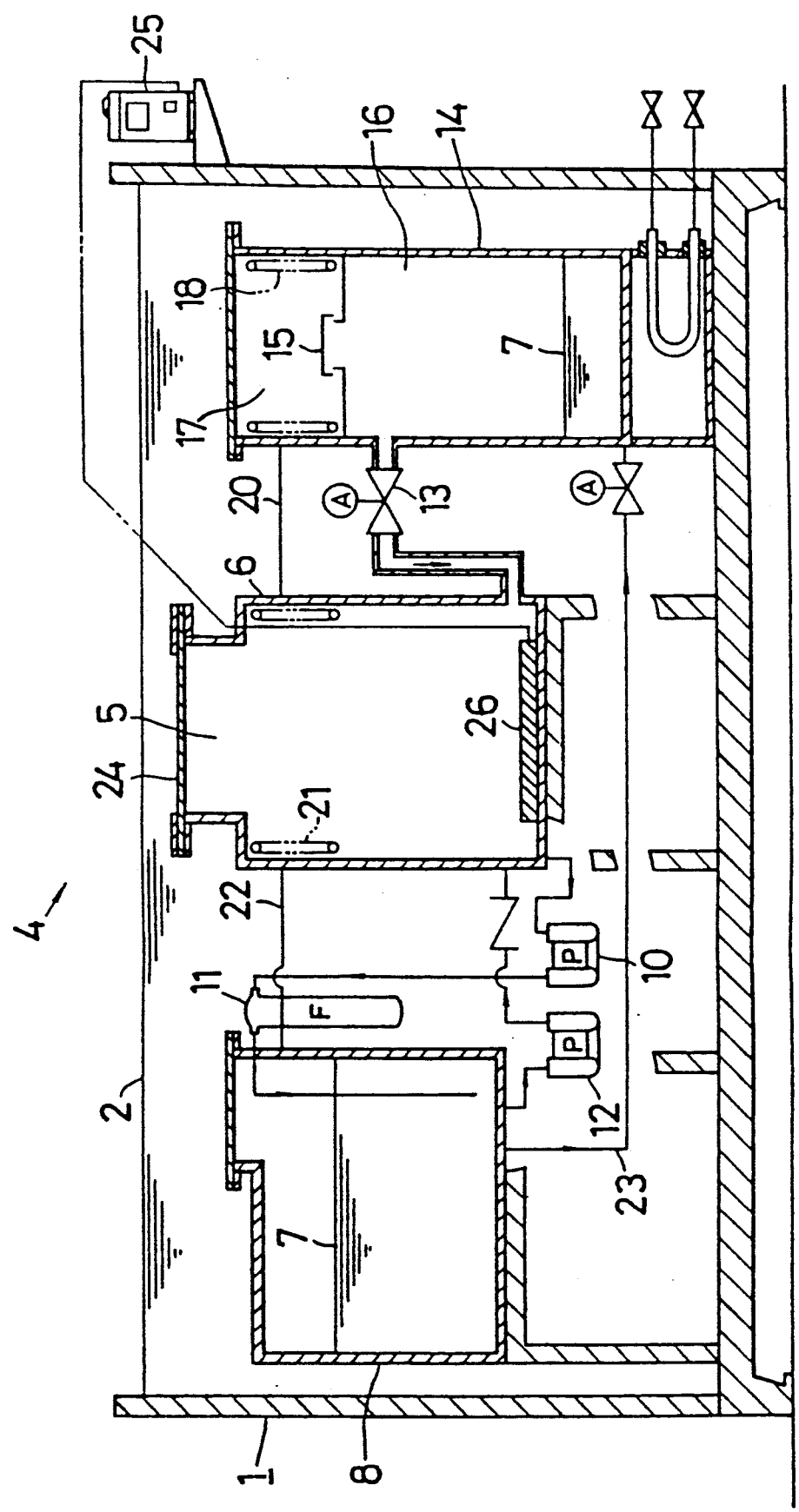
FIG. 4 is a cross-sectional view showing the state of the apparatus after the completion of a cleaning operation and prior to the commencement of a new cleaning operation.

After the completion of the vapor cleaning, as shown in FIG. 3, the incombustible liquid (2) is removed from the holding tank (1) until the gateway (5) of the cleaning tank (6) extends above the surface of the incombustible liquid (2), while the vapor generating tank (14) and the liquid solvent tank (8) remain submerged, then the gateway (5) of the cleaning tank (6) is opened, and the object (3) is removed. After the completion of the cleaning operation, as shown in FIG. 4, the holding tank (1) again filled with the incombustible liquid (2) until the cleaning tank (6), the vapor generating tank (14), and the liquid solvent (8) are all again submerged, and they are allowed to wait for the next cleaning operation.

As described above, since the cleaning means (4) is positioned within the incombustible liquid (2), and the cleaning means (4) is operated within the incombustible liquid (2) so as to clean the object (3), even if a solvent that is detrimental to the human body, environment, and the like, and wherein a combustible solvent or the like is used as a cleaning liquid and the solvent gas leaks outside of the cleaning means, the leaked solvent gas will be dissolved within or separated and held by means of the incombustible liquid (2), causing no risk of igniting thereby allowing cleaning that insures a high degree of safety, and even if combustion occurs within the cleaning means (4), the spread of such and the risk to the outside environment can be minimized since the cleaning means (4) is situated within the incombustible liquid (2).

Figure 5:
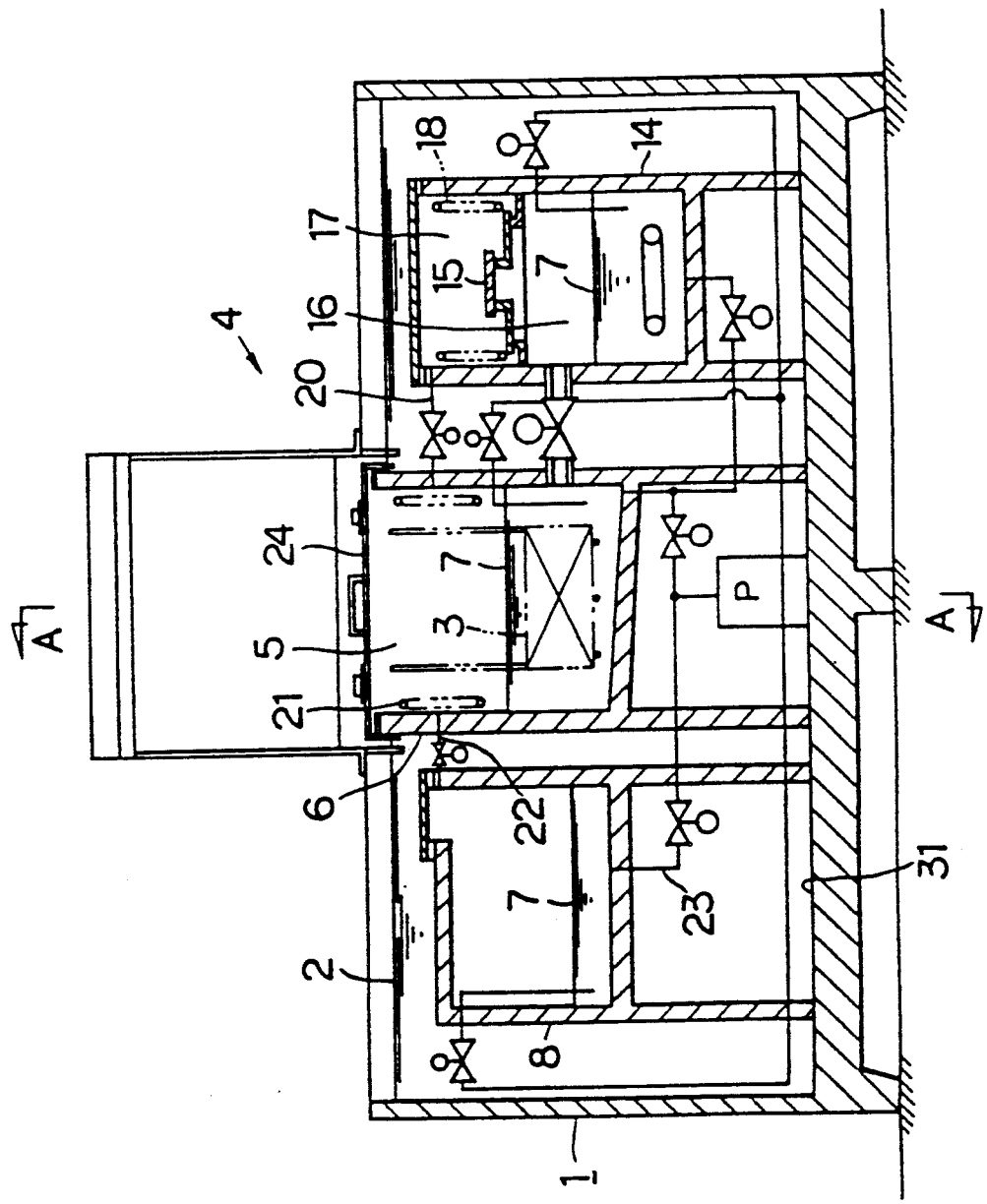
FIG. 5 is a cross-sectional view showing a second embodiment of the cleaning means of the present invention wherein the upper portion of the cleaning tank extends above the surface of the incombustible liquid.
Figure 6:
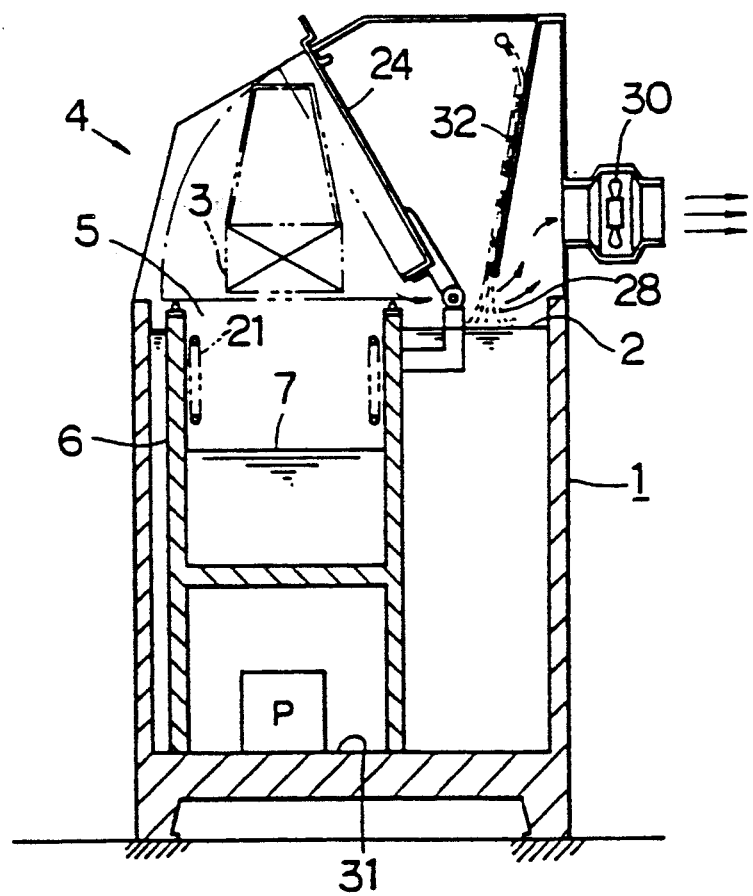
FIG. 6 is a cross-sectional view taken along line 6—6 of FIG. 5, showing the state where the lid is open and the solvent fumes are exhausted by means of an exhaust fan.

In the above embodiment, although the cleaning means (4) is submerged within the incombustible liquid (2) so as to allow a high degree of safety to be secured, in accordance with another embodiment as shown in FIG. 5, the gateway (5) positioned at the upper end of the cleaning tank (6) constituting the cleaning means (4), and the like, extends above from the incombustible liquid (2), is positioned within the holding tank (1), and is not submerged. By means of this construction, the object (3) can be introduced into or removed from the cleaning tank (6) through means of the gateway (5) without removing part of the incombustible liquid (2), and even if the solvent gas or liquid solvent (7) leaks from sections where pipelines and the like are connected and the incombustible liquid (2) is in contact, therewith the incombustible liquid (2) is in contact with the solvent gas and the liquid solvent (7) in the same way as above, thereby eliminating any risk of igniting, so that the safety of the cleaning operation can be increased remarkably. In this case, in order to prevent the solvent gas from diffusing during the time when the lid body (24) covering the gateway (5) is open, as shown in FIG. 6, a communication port (28) is provided within the rear of the holding tank (1) and behind the gateway (5), whereby the gas is directed toward a suction fan (30) through means of a cooling liquid curtain (32) that will come into contact with the solvent gas so as to condense the same thereby preventing the solvent gas leaking from the gateway (5) from diffusing into the environment.

Figure 7:
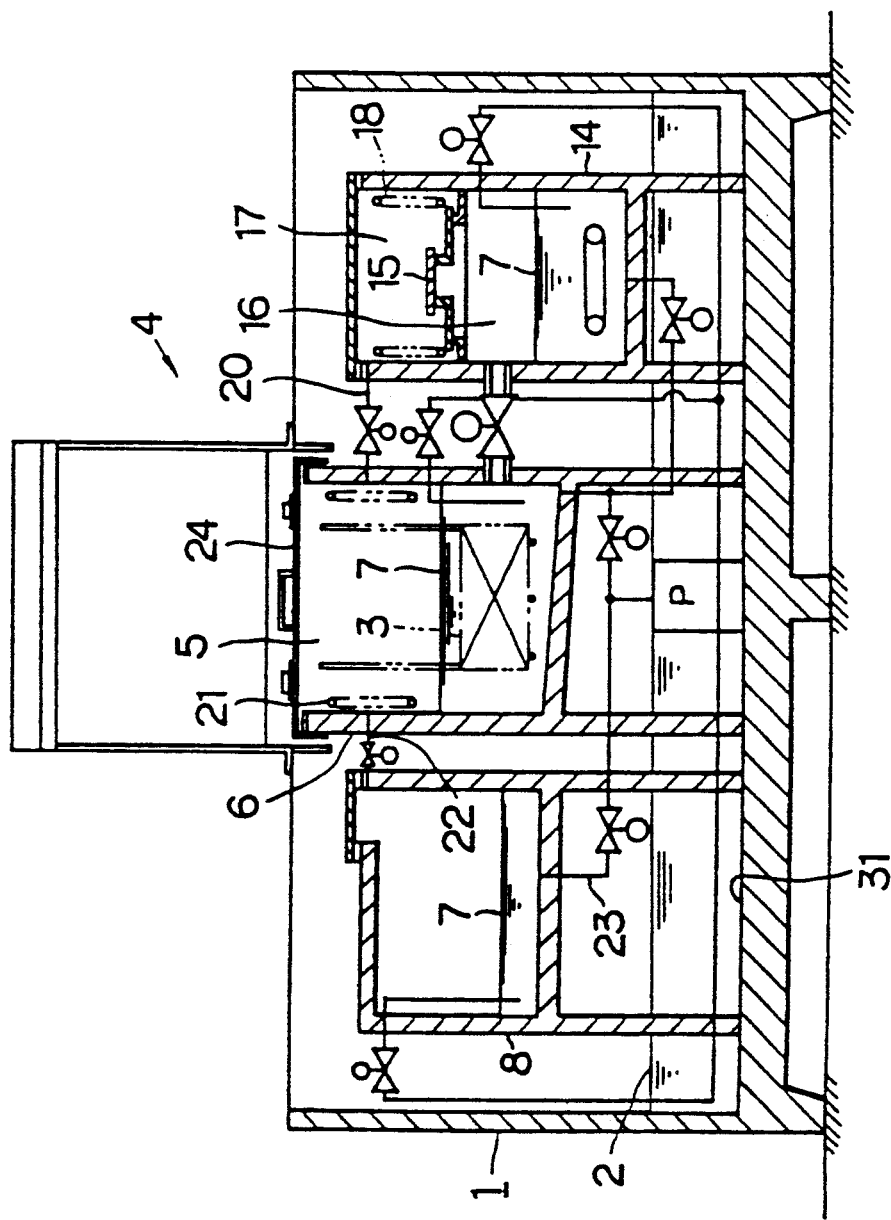
FIG. 7 is a cross-sectional view of a third embodiment of the present invention showing the state wherein the cleaning means is positioned above the surface of the incombustible liquid.

In the above embodiments, although the cleaning means (4) is allowed to be in direct contact with the incombustible liquid (2), in accordance with another different embodiment, as shown in FIG. 7, the incombustible liquid (2) is disposed only within the bottom portion (31) of the holding tank (1) without allowing the cleaning means (4) to be in direct contact with the incombustible liquid (2), and the cleaning means (4) is positioned above the surface of the incombustible liquid (2) whose amount is relatively small. In this case, the liquid solvent (7) leaking from the cleaning means (4) drops into the incombustible liquid (2), and becomes incombustible, and the solvent gas, if it has a specific gravity larger than that of air, remains within the holding tank (1) holding the cleaning means (4), and does not leak outside, thereof into the environment so that the safety of the cleaning operation can be increased.

Even if a solvent that is detrimental to the human body, environment, and the like such as, for example, Freon and trichloroethylene is used as a cleaning liquid, when the liquid solvent (7) has a specific gravity greater than that of the incombustible liquid (2) such as, for example, water, the solvent leaking from the cleaning means (4) settles within the bottom portion (31) of the holding tank (1) holding the incombustible liquid (2), so that not only the fear of any diffusion of the solvent gas to outside environment is obviated, but also the recovery of the solvent can be easily effected by using a moisture separating apparatus.

In the case wherein a terpene oil, a hydrocarbon solvent, or the like that has a specific gravity greater than that of the incombustible liquid (2) such as, for example, water and which does not dissolve in water is used as the liquid solvent (7), when a surface active agent is mixed with the water so as to allow the solvent (7) used for cleaning the object (3) to dissolve, the solvent does not float upon the surface of the incombustible liquid (2) so as to allow the solvent gas to diffuse into the atmosphere or environment even if the solvent has a specific gravity less than that of the incombustible liquid (2), so that the leakage of the liquid solvent (7) does not present a problem under such circumstances.

As described above, in the present invention, since a cleaning means holding a solvent as a cleaning liquid is positioned within a holding tank containing an incombustible liquid and is operated within the holding tank so as to carry out the cleaning of an object, even if an alcohol such as isopropyl alcohol, a terpene oil, a hydrocarbon oil, or other combustible solvent is used as a cleaning liquid and the solvent gas or the liquid solvent leaks outside the cleaning means, the leaking combustible solvent gas or liquid solvent comes into contact with the incombustible liquid such as, for example, water, so that the risk of igniting can be lowered, and cleaning with increased safety can be accomplished.

Furthermore, if the cleaning means is submerged within the incombustible liquid, and when an alcohol such as, for example, isopropyl alcohol, a terpene oil, a hydrocarbon oil, or other combustible solvent is used as a cleaning liquid and the solvent gas or the liquid solvent leaks from the cleaning means, the leaking combustible solvent gas or liquid solvent comes into contact with the incombustible liquid which is, for example, water or the like, so that the risk of igniting does not arise at all, and higher safety can be assured. When this submerged system is used, if combustion occurs within the cleaning means, its risk of spreading to the outside environment outside can be minimized since the cleaning means is positioned within the incombustible liquid. Furthermore, after the completion of the cleaning operation, if the cleaning means is submerged within the incombustible liquid, additional special safety mechanisms are not required, and the system can be safely maintained and controlled.

If part of the upper sections of the cleaning tank, and the like constituting the cleaning means extends above from the noncombustible liquid, and is placed within the holding tank with such part nonsubmerged, the object to be cleaned can easily be introduced into or removed from the cleaning tank, and if the solvent leaks from sections where pipelines and the like are connected and the incombustible liquid (2) is in contact, therewith since the incombustible liquid comes into contact with the solvent gas and liquid solvent in a manner similar to that described above, there is no risk of the cleaning solvent igniting, and the safety of the cleaning operation can be increased remarkably.

When the cleaning means is not in direct contact with the incombustible liquid and is disposed above the surface of the incombustible liquid contained within the bottom of the holding tank, the liquid solvent leaking from the cleaning means drops into the incombustible liquid and becomes incombustible, and if the solvent gas has a specific gravity greater than that of air, it remains within the holding tank holding the cleaning means, so that it does not leak outside, and the safety of the cleaning operation can be increased.

Furthermore, if a solvent that is detrimental to the human body, environment, or the like, for example such as Freon and trichloroethylene is used, and the solvent has a specific gravity greater than that of the incombustible liquid such as, for example, water, the solvent leaking from the cleaning means settles within the bottom of the holding tank containing the incombustible liquid, so that not only is there no fear of the dispersion of the solvent to the outside environment, but also the solvent can be easily recovered by using a moisture separating apparatus.

If a terpene oil, a hydrocarbon solvent, or the like that has a specific gravity less than that of the incombustible liquid such as, for example, water is used, and that does not dissolve in water, a surface active agent is mixed within the water so as to dissolve the solvent for cleaning the object to be cleaned, and then if a solvent having a specific gravity less than that of the incombustible liquid is used, the leaking solvent will dissolve within the incombustible liquid and is rendered incombustible, thereby preventing the risk of igniting.

Obviously, many modifications and variations of the present invention are possible in light of the above teachings. It is therefore to be understood that within the scope of the appended claims, the present invention may be practiced otherwise than as specifically described herein.

What is claimed is:

1. A method of cleaning an object by using an inflammable cleaning liquid, comprising the steps of:
   inserting a cleaning means, comprising a container, having an openable and closable cover, and for containing said inflammable cleaning liquid, within a holding tank;
   inserting said object to be cleaned within said container so as to be immersed within said inflammable cleaning liquid;
   filling said holding tank with an incombustible liquid such that said container is entirely immersed within said incombustible liquid; and
   operating said cleaning means so as to clean said object to be cleaned disposed within said container.

2. A method of cleaning an object as claimed in claim 1,
   characterized in that the incombustible liquid is water.

3. A method of cleaning an object as claimed in claim 1,
   characterized in that the incombustible liquid is water with which a surface active agent is mixed so that said cleaning liquid for cleaning the object, which is insoluble in water, can be dissolved therein.

4. A method of cleaning an object as claimed in claim 1, characterized in that said cleaning liquid for cleaning the object is a combustible solvent.

5. Apparatus for cleaning an object by using an inflammable cleaning liquid, comprising:
   a holding tank;
   an incombustible liquid disposed within said holding tank; and
   cleaning means, comprising a container having an openable and closable cover through which said object to be cleaned can be inserted and removed; and
   an inflammable cleaning liquid, for cleaning said object to be cleaned, disposed within said cleaning means container such that said object to be cleaned can be immersed within said inflammable cleaning liquid;
   said cleaning means container, having said inflammable cleaning liquid disposed therein, being disposed within said holding tank such that cleaning liquid container is entirely immersed within said incombustible liquid disposed within said holding tank.

6. An apparatus for cleaning an object as claimed in claim 5,
   characterized in that the incombustible liquid is water.

7. An apparatus for cleaning an object as claimed in claim 5,
characterized in that the incombustible liquid is water with which a surface active agent is mixed so that said cleaning liquid for cleaning the object, which is insoluble in water, can be dissolved therein.

8. An apparatus for cleaning an object as claimed in claim 5, characterized in that said cleaning liquid for cleaning the object is a combustible solvent.

9. A method of cleaning an object by using an inflammable cleaning liquid, comprising the steps of:
inserting a cleaning means within a container, having an openable and closable cover through which said object to be cleaned can be inserted and removed, and within which is disposed said inflammable cleaning liquid;
inserting said container within a holding tank;
opening said cover of said container, inserting said object to be cleaned within said container such that said object to be cleaned is immersed within said inflammable cleaning liquid, and closing said cover of said container;
filling said holding tank with an incombustible liquid such that only an upper portion of said container, within which said cover is provided for insertion and removal of said object to be cleaned, is disposed above the upper surface of said incombustible liquid disposed within said holding tank; and
energizing said cleaning means disposed within said container so as to clean said object to be cleaned which is also disposed within said container.

10. A method of cleaning an object by using an inflammable cleaning liquid, comprising the steps of:
inserting a cleaning means within a container, having an openable and closable cover through which said object to be cleaned can be inserted and removed, and within which is disposed said inflammable cleaning liquid;
inserting said container within a holding tank;
opening said cover of said container, inserting said object to be cleaned within said container such that said object to be cleaned is immersed within said inflammable cleaning liquid;
filling said holding tank with an incombustible liquid such that the upper surface of said incombustible liquid is disposed beneath said container whereby any leakage of said inflammable cleaning liquid from said container will fall into said incombustible liquid, under the influence of gravity, disposed within said holding tank; and
energizing said cleaning means disposed within said container so as to clean said object to be cleaned which is also disposed within said container.

11. Apparatus for cleaning an object to be cleaned by using an inflammable cleaning liquid, comprising:
a holding tank;
a container, having an openable and closable cover through which said object to be cleaned can be inserted and removed, disposed within said holding tank;
an inflammable cleaning liquid, for cleaning said object to be cleaned, disposed within said container such that said object to be cleaned is immersed within said inflammable cleaning liquid;
cleaning means disposed within said inflammable cleaning liquid disposed within said container;
an incombustible liquid disposed within said holding tank to such a level such that only an upper portion of said container, within which said cover is provided for insertion and removal of said object to be cleaned, is disposed above the upper surface of said incombustible liquid disposed within said holding tank; and
means for energizing said cleaning means disposed within said inflammable cleaning liquid disposed within said container so as to clean said object to be cleaned which is also disposed within said container.

12. Apparatus for cleaning an object to be cleaned by using an inflammable cleaning liquid, comprising:
a holding tank;
a container, having an openable and closable cover through which said object to be cleaned can be inserted and removed, disposed within said holding tank;
an inflammable cleaning liquid, for cleaning said object to be cleaned, disposed within said container such that said object to be cleaned is immersed within said inflammable cleaning liquid;
cleaning means disposed within said inflammable cleaning liquid disposed within said container;
an incombustible liquid disposed within said holding tank to such a level that the upper surface of said incombustible liquid is disposed beneath said container whereby any leakage of said inflammable cleaning liquid from said container will fall into said incombustible liquid, under the influence of gravity, disposed within said holding tank; and
means for energizing said cleaning means disposed within said inflammable cleaning liquid disposed within said container so as to clean said object to be cleaned which is also disposed within said inflammable cleaning liquid disposed within said container.

13. A method as set forth in claim 9, wherein:
said incombustible liquid is water.

14. A method as set forth in claim 9, wherein:
said incombustible liquid is water with which a surface active agent is mixed so that said cleaning liquid for cleaning said object, which is insoluble in water, can be dissolved therein.

15. A method as set forth in claim 9, wherein:
said cleaning liquid for cleaning said object is a combustible solvent.

16. A method as set forth in claim 10, wherein:
said incombustible liquid is water.

17. A method as set forth in claim 10, wherein:
said incombustible liquid is water with which a surface active agent is mixed so that said cleaning liquid for cleaning said object, which is insoluble in water, can be dissolved therein.

18. A method as set forth in claim 10, wherein:
said cleaning liquid for cleaning said object is a combustible solvent.

19. Apparatus as set forth in claim 11, wherein:
said incombustible liquid is water.

20. Apparatus as set forth in claim 11, wherein:
said incombustible liquid is water with which is mixed a surface active agent so that said cleaning liquid for cleaning said object, which is insoluble in water, can be dissolved therein.

21. Apparatus as set forth in claim 11, wherein:
said cleaning liquid for cleaning said object is a combustible solvent.

22. Apparatus as set forth in claim 12, wherein:
said incombustible liquid is water.

23. Apparatus as set forth in claim 12, wherein:

said incombustible liquid is water with which is mixed a surface active agent so that said cleaning liquid for cleaning said object, which is insoluble in water, can be dissolved therein.

24. Apparatus as set forth in claim 12, wherein:

said cleaning liquid for cleaning said object is a combustible solvent.

* * * * *